United States Patent
Sonntag

[19]

[11] Patent Number: 6,098,816
[45] Date of Patent: Aug. 8, 2000

[54] FASTENING SYSTEM FOR FASTENING A PLATE WITHIN AN ENCLOSURE

[75] Inventor: John-Erik Sonntag, Ekenäs, Finland

[73] Assignee: Fibox Oy AB, Jorvas, Finland

[21] Appl. No.: 09/055,867

[22] Filed: Apr. 6, 1998

[30] Foreign Application Priority Data

Apr. 7, 1997 [FI] Finland ................................ 971442

[51] Int. Cl.[7] .................................................. A47G 19/08
[52] U.S. Cl. ............................................................ 211/41.1
[58] Field of Search ............................... 211/41.1, 41.17; 361/415, 399

[56] References Cited

U.S. PATENT DOCUMENTS

| | | | |
|---|---|---|---|
| 4,592,610 | 6/1986 | Bowls | 211/41.17 |
| 4,745,524 | 5/1988 | Patton, III | 211/41.17 |
| 4,927,111 | 5/1990 | Takahashi | 211/41.17 |
| 5,377,080 | 12/1994 | Lin . | |

FOREIGN PATENT DOCUMENTS

| | | |
|---|---|---|
| 31 35 224 | 3/1983 | Germany . |
| 02110939 | 1/1992 | Japan . |
| 1248960 | 10/1971 | United Kingdom . |

*Primary Examiner*—Alvin Chin-Shue
*Assistant Examiner*—Sarah Purol
*Attorney, Agent, or Firm*—Altera Law Group, LLC

[57] ABSTRACT

The invention relates to a fastening system for fastening a plate within an enclosure, which enclosure comprises a bottom part (1) and a cover and which fastening system is particularly suitable for fastening a front plate or a contact protective plate (7) within an enclosure for electric installations and comprises an elongated holder (20) to be placed vertically in the bottom part of the enclosure. For mounting a plate (7) rapidly and easily at a desired height in the enclosure, the fastening system comprises the elongated holder (20) comprising a plurality of flexible protrusions (21) located at a distance from each other and formed in the longitudinal direction of the holder, between which protrusions there is a slit (22) for receiving a support member (8), which comprises fastening means for fastening the plate (7) to the support member and at least one protruding tongue member (9, 10) to be placed inside the slit of the holder, and between the tongue and the elastic protrusions is formed a projection (12), which, by being arranged in a recess, prevents the tongue member in the slit from being removed from the slit without the protrusions (21) yielding (FIG. 2)

16 Claims, 3 Drawing Sheets

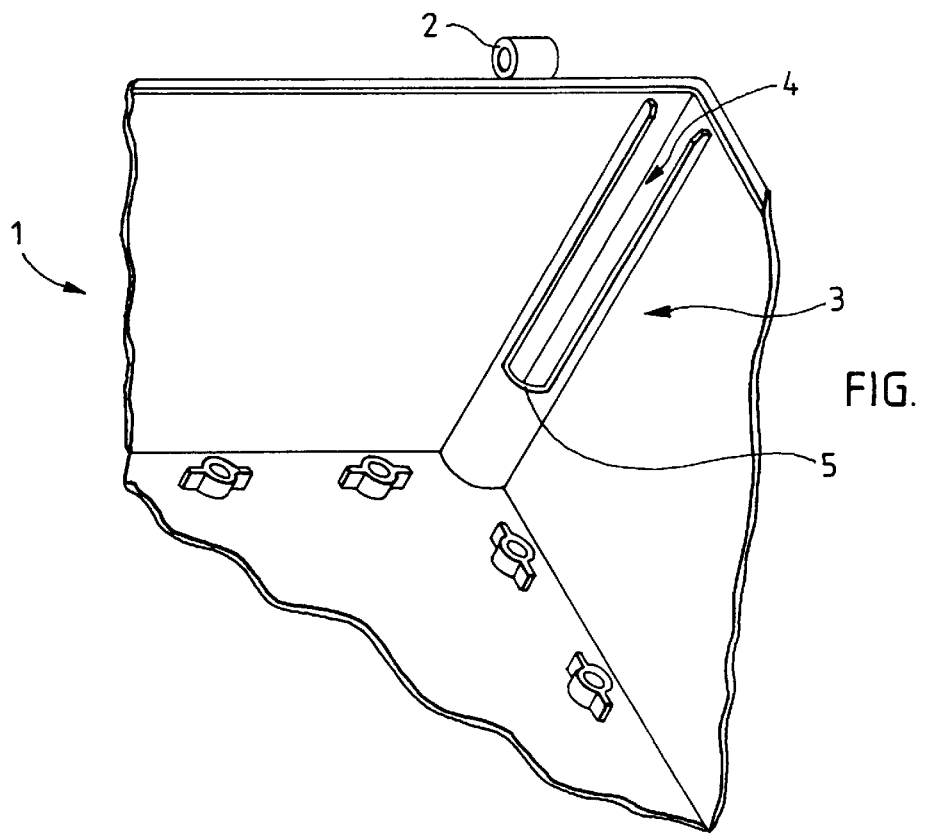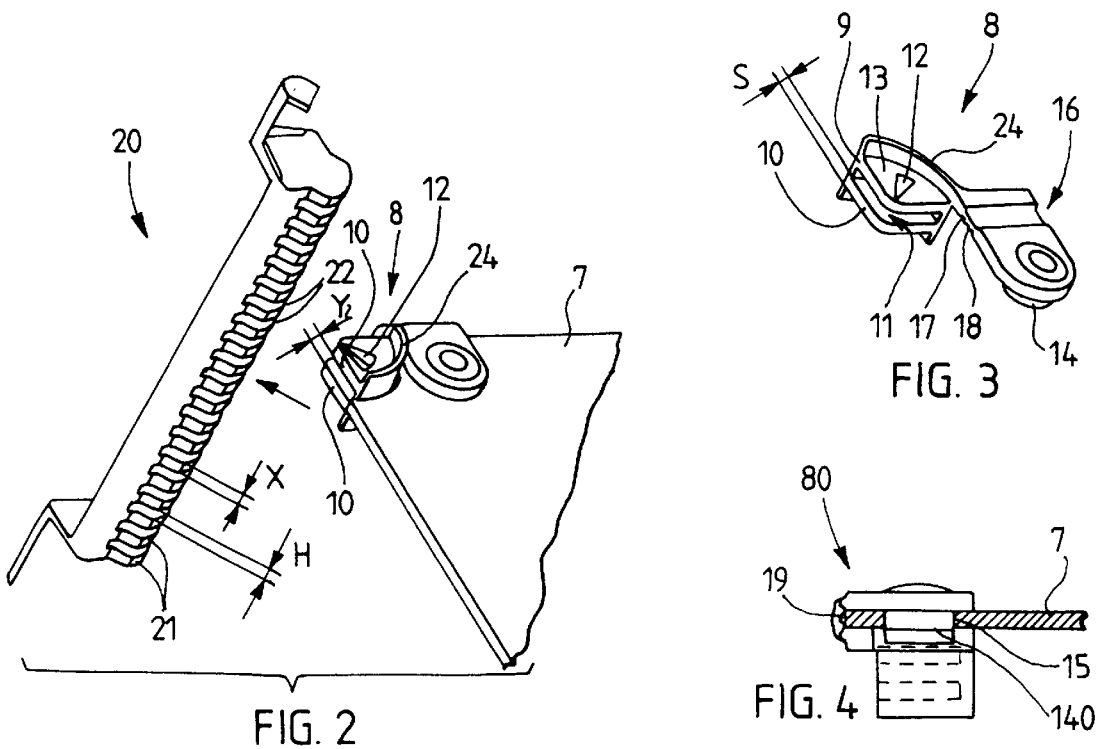

FASTENING SYSTEM FOR FASTENING A PLATE WITHIN AN ENCLOSURE

BACKGROUND OF THE INVENTION

The invention relates to a fastening system for fastening a plate within an enclosure, which enclosure comprises a bottom part and a cover and which fastening system is particularly suitable for fastening a front plate or a contact protective plate within an enclosure for electric installations and comprises an elongated holder to be placed vertically inside the bottom part of the enclosure.

Enclosures to be used for electric installations often comprise a front plate or a plate protecting against contact, which plate is mounted within the enclosure. The contact protective plate is made of an insulating material and intends to improve the safety of the enclosure by preventing the possibility of an electric shock. Depending on the enclosure and its content, the contact protective plate is mounted at different heights from the bottom of the enclosure.

For mounting a contact protective plate at different heights from the bottom of the enclosure, it is very common to use fixed spacing pieces, the height of which has to be chosen separately for each installation. This is inconvenient, of course, because the mounting requires in practice a spacing piece of a suitable size to be chosen typically from a great number of spacing pieces. Additionally, because said plate is fastened to the spacing piece by screws, a screwdriver or other tools have to be used. In case if changes are desired later on in a finished enclosure provided with electric components, the plate must also possibly be mounted at another height from the bottom of the enclosure than it was previously. This requires replacing existing spacing pieces by other spacing pieces having a suitable height. Further, as far as manufacturing technique and storage are concerned, it is not preferable to have components of several different kinds.

It is also known to use rails to be arranged in the corners of the enclosure, to which rails the contact protective plates or other plates are fastened. A problem with rails is that, because they are made of plastic, they break easily when a screw holding the plate fastened to the rail is fastened to them. Tools are needed for fastening plates to rails. In addition, if a rail already comprises a hole for a screw and the position of the screw has to be changed on account of a later change in the content of the enclosure, a weak point susceptible to breakage remains at the rail.

SHORT DESCRIPTION OF THE INVENTION

The object of the invention is thus to provide a new fastening system avoiding said problems. To implement this, the present invention provides a fastening system for fastening a plate within an enclosure, which enclosure comprises a bottom part and a cover and which fastening system is particularly suitable for fastening a front plate or a contact protective plate within an enclosure for electric installations and comprises an elongated holder to be placed vertically in the bottom part of the enclosure, wherein the elongated holder comprises a plurality of elastic protrusions located at a distance from each other and formed in the longitudinal direction of the holder, between which protrusions there is a slit for receiving a support member comprising fastening means for fastening the plate to the support member and at least one protruding tongue member to be placed inside the slit of the holder, and that between the tongue and the elastic protrusions is formed a projection, which prevents the tongue member in the slit from being removed from the slit without the protrusions yielding.

Preferred embodiments of the fastening system according to the invention are presented in attached claims 2 to 13.

The greatest advantages of the fastening system of the invention are that the holder belonging to it enables a simple and rapid mounting of a plate at many different heights. No tools are needed for fastening the support member to the holder. The support member can be displaced later easily and rapidly to a different level of height of the holder also without needing tools and without the risk that the holder breaks or weakens on account of the displacement and modification. Further, if the holder comprises an elongated arm to be fastened to a corner turret formed inside the enclosure, the holder does not take up space from the area of the bottom of the bottom part.

DESCRIPTION OF THE FIGURES OF THE INVENTION

In the following, the invention is described by means of two embodiments with reference to the attached drawing, where FIG. 1 shows a corner of an enclosure;

FIGS. 2 to 4 show components of a first embodiment of a fastening system in such a way that FIG. 2 shows a holder on the left side and a support member fastened to a contact protective plate on the right side and FIG. 3 shows the support member loose from the contact protective plate and FIG. 4 fastened to the contact protective plate;

DETAILED DESCRIPTION OF THE INVENTION

Figure 6:
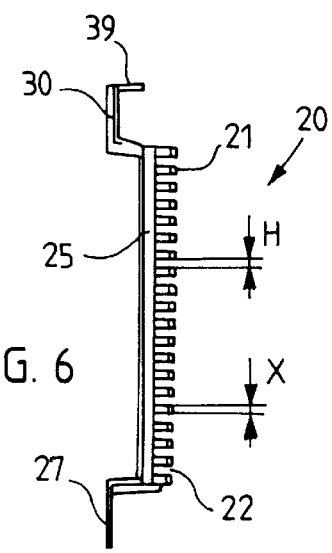

FIG. 1 shows a corner of a bottom part 1 of an enclosure suitable for electric installations. A cover (not shown) of the enclosure is fastened to a hinge part 2. Inside the bottom part 1, there is a corner turret 3. The corner turret 3 comprises a slot 4 for receiving a comb-like holder 20 according to FIG. 6. The slot 4 does not extend down to the bottom of the corner turret 3, but the bottom 5 of the slot is arranged to support the holder of the figure from below. Below the slot 5, there is the lowest recess of the corner turret, which recess is meant to receive an arm 27 formed at the lower end of the holder of FIG. 6.

In FIG. 2, the reference numeral 7 indicates a contact protective plate comprising a fastening hole at a corner, into which hole a support member 8 according to FIG. 3 is fastened.

The support member 8 of FIGS. 2 and 3 comprises two tongue members 9, 10 having a slit 11 between them. Surfaces 13 on the tongue members 9, 10 comprise an arrow-shaped projection 12 projecting from the surfaces 13 on which they are formed. FIG. 3 shows only the projection 12 and the surface 13 of the tongue member 9, while the projection of the tongue member 10 and the respective surface remain invisible below the tongue member 10.

The support member 8 comprises a pin 14 intended to be pressed manually into a fastening hole 15 in the contact protective plate 7, see FIG. 4, in which a pin 140 of a support member 80, being a mirror image of the support member of FIG. 3, is mounted in the hole 15. The tolerance between the fastening hole 15 and the pin 140 is narrow so that the pin remains fastened to the edges of the hole 15 by friction joint. From FIGS. 2 and 4 appears that the tongue members of the support member 8 of FIG. 3 have to be turned 180 degrees with respect to the pin 14, before the support member is in the position according to FIGS. 2 and 4. For bending, the support member 8 comprises a hinge area 16 of film hinge type, which area is provided with two material weakenings 17, 18 so that the hinge area 16 can be bent around the plate 7 in such a way that the hinge area bears against an edge 19 of the plate, cf. FIG. 4. The distance between the material weakenings 17, 18 corresponds to the thickness of the plate 7.

In FIG. 2, the support member 8 fastened to the plate 7 is in a position in which it can be brought, by being moved in the arrow direction, inside the holder 20 to be arranged in the corner turret 3 in the bottom part 1 of the enclosure.

The holder 20 comprises twenty protrusions 21 at equal distances from each other for receiving the tongue members 9, 10 of the support member, whereby the tongue members will be received by slits 22 formed between the protrusions. The thickness X of the protrusions 21 corresponds to the size Y of a slit between the tongue members 9, 10 and the thickness S of the tongue members corresponds to the size H of the slits 22 between the protrusions. The protrusions 21 have been made flexible or elastic, which makes them flex or yield when the projection 12 hits the edge of the protrusion when the tongue members 9, 10 are pushed into the slits 22. When being pushed, the support member 8 snaps to its place in the holder 20. When the tongue members 9, 10 are in the slits 22, the elastic force of the protrusions 21 prevents the tongue members from being removed from the slits, if the support member 8 is not pulled off from the holder 20 with a relatively strong force, which makes the snap joint open. To provide a snap joint, the protrusions 21 comprise recesses or holes 23 for receiving the projections 12, see FIG. 5 and FIG. 8, in which the hole is drawn by a broken line.

By means of this arrangement, the support member 8 can be safely fastened to the holder 20. In order that the support member 8 may be supported well on the holder 20, it comprises a support wall 24 designed to correspond to the design of the points of the protrusions 21. In the case of the figures, the shape is a circular arc.

Figure 5:
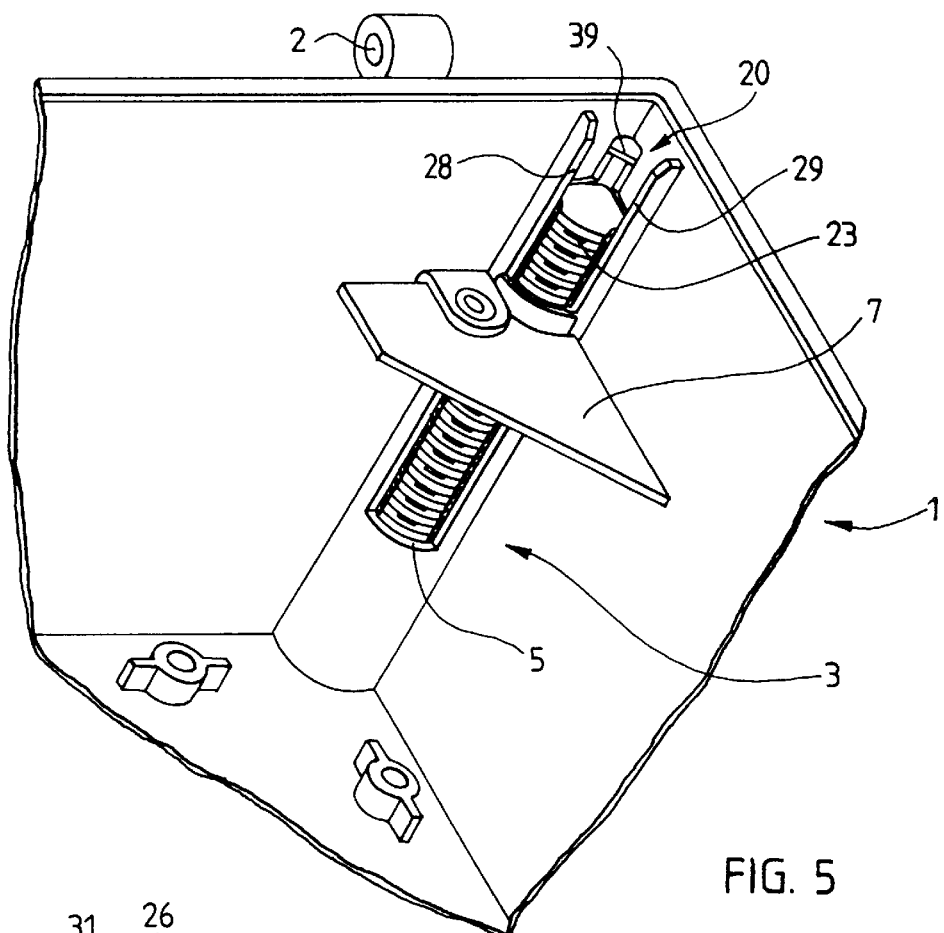
FIG. 5 shows how the contact protective plate is fastened to the enclosure by using the fastening system according to FIGS. 2 to 4.

FIG. 5 shows a contact protective plate 7 fastened to a corner turret 3 of an enclosure by means of the fastening system of FIG. 2.

Figure 8:
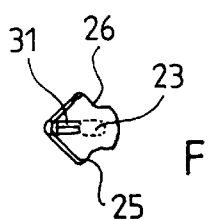
FIGS. 6 to 8 show the holder belonging to the fastening system from the side and from above.
Figure 7:
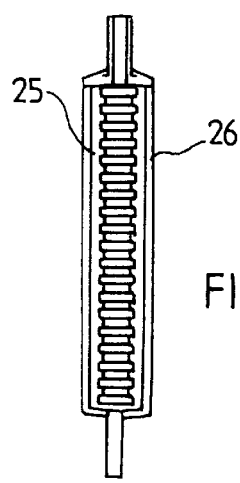

From FIGS. 7 and 8 is seen that the holder 20 comprises two support surfaces 25 and 26 and an arm 27. The support surfaces 25, 26 are supported against edge areas 28, 29 of the slot 4 of the corner turret 3 and the arm 27 extends into the bottom part of the corner turret, see FIG. 5.

From the figures appears also that the holder 20 comprises an arm 30 having a visor-like plate part 39 at its end. The plate part 39 is supported on the cover (not shown) of the enclosure, which keeps the holder 20 at an exactly correct place inside the enclosure.

Figure 9:
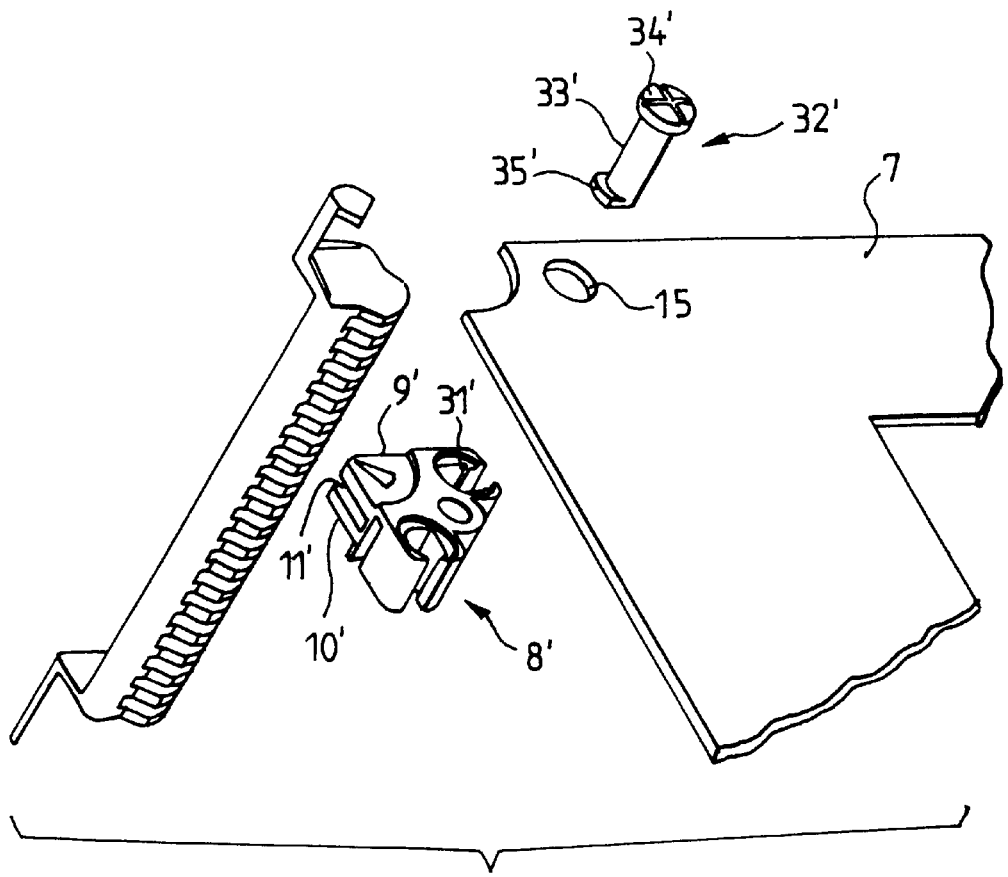
FIG. 9 shows components of a second embodiment of the fastening system, comprising a holder according to FIG. 6, a support member and a fastening pin, by which a contact protective plate can be fastened to a corner of the enclosure of FIG. 1.

FIG. 9 shows an alternative to FIG. 2 for providing the fastening system according to the invention.

Figure 10:
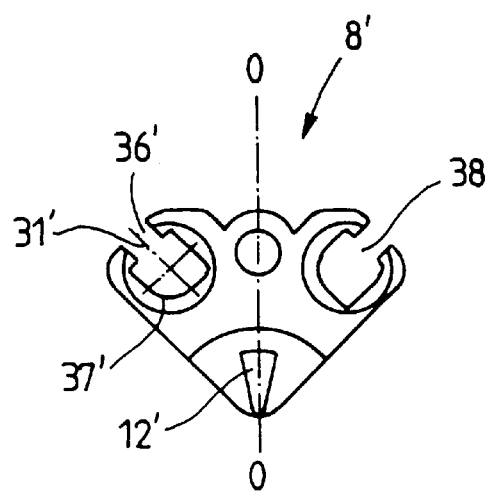
FIG. 10 shows the support member of the fastening system of FIG. 9 from above.

As far as the holder 20' is concerned, the fastening system of FIG. 9 corresponds exactly to the fastening system of FIG. 2, but the support member 8' is different. The support member 8' comprises tongue members 9', 10' according to the support member 8 of FIG. 3, but the fastening parts for fastening the support member 8' to the plate 7 differ from the fastening parts 14, 16 of FIG. 3. In the case of FIG. 9, the fastening parts comprise a boring 31' and a fastening pin 32'. The boring 31' is intended for receiving the fastening pin 32'. The fastening pin 32' comprises an arm part 33', a head 34' and an ear 35'. The head 34' is bigger than the arm part 33' and the ear 35' is eccentrically arranged with respect to the arm part 33'. The plate 7 is locked between the head 34' of the fastening pin and the support member 8'. The shape of the boring 31' differs from the circular shape, whereby the ear 35' can be fastened to an edge 37' of the boring and released from that by turning the fastening pin 32', cf. FIG. 10, showing the support member 8' from above. The shape of the boring 31' that differs from the circular shape has been achieved by means of a slot 36'. After the ear 35' of the fastening pin has been placed in line with the slot 36', the fastening pin fastened to the support member 8' can be released from the support member 8' by lifting. When the ear 35' placed in the slot 36' is turned, the ear 35' can be fastened to the lower edge 37' of the boring 31', whereby a release of the fastening pin 32' from the support member 8' by lifting is prevented.

From FIGS. 9 and 10 appears that the support member 8' comprises, besides the boring 31', also another boring 38', the borings being arranged symmetrically with respect to the axis O—O of the support member. Thanks to the two borings 31', 38', the support member can be fastened to the plate 7 by means of the boring 31', or alternatively, by means of the boring 38'.

The holder 20, the support member 8, 80, 8' and the fastening pin 32' are manufactured of plastic by molding. The shape of the holder is such that the tool required for the manufacture of the holder is cost effective and reliable without service failures.

The invention has been described above by means of only two preferred embodiments, and it is pointed out therefore that the invention can be implemented in many ways within the scope of the attached claims. Accordingly, the number of protrusions of the holder can vary. Preferably, the number of protrusions is 10 to 30, but it is conceivable that there are only about 5 protrusions or more than 30 of them. The support member does not necessarily need two tongue members 9, 10, but this is very advantageous, because two locking levels are thus created, which make the support member very stable in the height direction. Thanks to the two locking levels, the tolerances between a tongue member and the slot do not need to be so narrow, and nevertheless, the support member is provided with a good stability in the vertical direction so that the support member is not able to swing in the vertical direction. Instead of providing the tongue member of the support member with a projection and the holder with a recess or a hole, it is conceivable to form the projection on the protrusions of the holder and the recess or hole in the tongue member of the support member.

I claim:

1. Fastening system for fastening a plate within an enclosure, which enclosure comprises a bottom part and a cover and which fastening system is particularly suitable for fastening a front plate or a contact protective plate within an enclosure for electric installations, the fastening system comprising an elongated holder to be placed vertically in the bottom part of the enclosure, wherein the elongated holder comprises a plurality of flexible protrusions located a distance from each other and formed in a longitudinal direction of the holder, between which protrusions there is a slit for receiving a support member comprising fastening means for fastening the plate to the support member and at least one protruding tongue member to be placed inside the slit of the holder and wherein between the tongue and the elastic protrusions is formed a projection, which by being arranged in a recess prevents the tongue member in the slit from being removed from the slit without the protrusions yielding.

2. Fastening system according to claim 1, wherein the projection is formed on the tongue member and projects from it and wherein the recess is formed in the protrusion.

3. Fastening system according to claim 1, wherein a thickness S of the tongue member corresponds to size H of the slit between the protrusions of the holder.

4. Fastening system according to claim 1, wherein the support member comprises two tongue members, between which there is a slit having a size Y, which corresponds to a thickness X of the protrusions of the holder.

5. Fastening system according to claim 1, for fastening a plate provided with a fastening hole to an enclosure, wherein the fastening means of the support member comprise a boring for receiving a fastening pin, which comprises an arm part and a head being bigger than the arm part, for holding the plate between the head and the support member in such a way that the fastening pin penetrates the fastening hole.

6. Fastening system according to claim 5, wherein an end of the fastening pin, which end is opposite to the head, comprises an ear arranged eccentrically with respect to the arm part, and wherein a form of the boring differs from a form of a circle, whereby the ear is arranged to be fastened in an axial direction of the boring to an edge of the boring and to be released from that by turning the fastening pin, respectively.

7. Fastening system according to claim 6, wherein the boring comprises a slot for receiving the ear in the release position of the fastening pin.

8. Fastening system according to claim 5, wherein the support part comprises two borings for receiving selectively the fastening pin in each boring.

9. Fastening system according to claim 1 for fastening a plate provided with a fastening hole to an enclosure, wherein the fastening means of the support member comprise a pin to be mounted in a fastening hole of the plate for fastening the support member to the plate, which pin is attached to the tongue member of the support member through a hinge area of film hinge type for turning the tongue member of the support member 180 degrees with respect to the pin so that the hinge area bears against an edge of the plate.

10. Fastening system according to claim 1, wherein the holder comprises at its one end an elongated arm to be placed into a corner turret inside the bottom part of the enclosure.

11. Fastening system according to claim 10, wherein the holder comprises at its opposite end an arm, the end of which is provided with a plate part for being supported on the cover of the enclosure to prevent a vertical movement of the holder.

12. Fastening system according to claim 1, wherein the holder comprises 10 to 30 protrusions.

13. Fastening system according to claim 1, wherein the holder comprises two support surfaces following the longitudinal direction of the holder and forming an angle with respect to each other for mounting the holder unpivotally to a corner turret positioned inside the bottom part of the enclosure and comprising a slot, whereby edge areas of the slot are arranged to support said support surfaces.

14. Fastening system according to claim 2 for fastening a plate provided with a fastening hole to an enclosure, wherein the fastening means of the support member comprise a pin to be mounted in the fastening hole of the plate for fastening the support member to the plate, which pin is attached to the tongue member of the support member through a hinge area of film hinge area of film hinge type for turning the tongue member of the support member 180 degrees with respect to the pin so that the hinge area bears against the edge the plate.

15. Fastening system according to claim 3 for fastening a plate provided with a fastening hole to an enclosure, wherein the fastening means of the support member comprise a pin to be mounted in the fastening hole of the plate for fastening the support member to the plate, which pin is attached to the tongue member of the support member through a hinge area of film hinge area of film hinge type for turning the tongue member of the support member 180 degrees with respect to the pin so that the hinge area bears against the edge the plate.

16. Fastening system according to claim 4 for fastening a plate provided with a fastening hole to an enclosure, wherein the fastening means of the support member comprise a pin to be mounted in the fastening hole of the plate for fastening the support member to the plate, which pin is attached to the tongue member of the support member through a hinge area of film hinge area of film hinge type for turning the tongue member of the support member 180 degrees with respect to the pin so that the hinge area bears against the edge the plate.

\* \* \* \* \*